(12) United States Patent
Goldfarb (10) Patent No.: US 8,571,511 B2
(45) Date of Patent: Oct. 29, 2013

(54) APPARATUS AND METHOD FOR A WIDEBAND RF MIXER

(75) Inventor: Marc Goldfarb, Atkinson, NH (US)

(73) Assignee: Analog Devices, Inc., Norwood, MA (US)

( * ) Notice: Subject to any disclaimer, the term of this patent is extended or adjusted under 35 U.S.C. 154(b) by 74 days.

(21) Appl. No.: 13/158,283

(22) Filed: Jun. 10, 2011

(65) Prior Publication Data

US 2012/0314811 A1 Dec. 13, 2012

(51) Int. Cl.
*H04B 1/26* (2006.01)
*H04B 1/18* (2006.01)
*H03D 7/14* (2006.01)

(52) U.S. Cl.
CPC ........... *H03D 7/1441* (2013.01); *H04B 1/18* (2013.01)
USPC ............ 455/323; 455/326; 455/290; 455/292

(58) Field of Classification Search
USPC .............. 455/323, 325, 326, 340, 290, 191.1, 455/120, 125
See application file for complete search history.

(56) References Cited

U.S. PATENT DOCUMENTS

| | | | | |
|---|---|---|---|---|
| 3,727,078 A | * | 4/1973 | Wollesen | 327/113 |
| 4,063,179 A | * | 12/1977 | Brown | 455/166.1 |
| 4,399,559 A | * | 8/1983 | Theriault | 455/179.1 |
| 4,619,001 A | * | 10/1986 | Kane | 455/192.3 |
| 4,980,810 A | | 12/1990 | McClanahan et al. | |
| 5,121,084 A | | 6/1992 | Anderson et al. | |
| 5,553,319 A | * | 9/1996 | Tanbakuchi | 455/326 |
| 5,710,981 A | | 1/1998 | Kim et al. | |
| 5,867,061 A | | 2/1999 | Rabjohn et al. | |
| 5,959,499 A | | 9/1999 | Khan et al. | |
| 6,009,318 A | * | 12/1999 | Freed | 455/326 |
| 6,337,974 B1 | | 1/2002 | Inamori et al. | |
| 6,650,180 B2 | | 11/2003 | Lautzenhiser et al. | |
| 6,653,885 B2 | * | 11/2003 | Wu et al. | 327/356 |
| 6,683,499 B2 | | 1/2004 | Lautzenhiser et al. | |
| 6,690,238 B2 | | 2/2004 | Lautzenhiser et al. | |
| 6,711,395 B1 | * | 3/2004 | Tonegawa et al. | 455/313 |

(Continued)

FOREIGN PATENT DOCUMENTS

| | | |
|---|---|---|
| CA | 2374784 | 6/2003 |
| CA | 2374794 | 6/2003 |

OTHER PUBLICATIONS

WiMAX/WiBro RF MxFE Transceiver: AD9352. Datasheet [online]. Analog Devices, Inc., Aug. 2007 [retrieved on Jan. 23, 2013]. Retrieved from the Internet: <URL: http://www.analog.com/static/imported-files/data_sheets/AD9352.pdf>.

(Continued)

*Primary Examiner* — Duc M Nguyen (74) *Attorney, Agent, or Firm* — Knobbe, Martens, Olson & Bear LLP (57) ABSTRACT

Apparatus and methods of manufacture for a wideband RF mixer are provided. The RF mixer includes an input, an LO input, and an output. A variable impedance tuner is disposed in an input signal path between the input port and the RF mixer, and a variable impedance tuner is disposed in an output signal path between the output and the RF mixer. The impedances of the variable impedance tuners are controllable for a particular frequency of operation with one or more digital or analog control signals.

17 Claims, 8 Drawing Sheets

(56) References Cited

U.S. PATENT DOCUMENTS

| | | | |
|---|---|---|---|
| 6,747,517 | B2 | 6/2004 | Lautzenhiser et al. |
| 6,900,696 | B2 | 5/2005 | Lautzenhiser et al. |
| 6,922,106 | B2 | 7/2005 | Lautzenhiser et al. |
| 7,053,718 | B2 | 5/2006 | Dupuis et al. |
| 7,072,636 | B2 * | 7/2006 | Dobrovolny .................. 455/313 |
| 7,190,229 | B1 | 3/2007 | Lautzenhiser et al. |
| 7,215,206 | B2 | 5/2007 | Dupuis et al. |
| 7,418,244 | B2 | 8/2008 | Montalvo |
| 7,570,116 | B2 | 8/2009 | Haila et al. |
| 7,944,307 | B2 | 5/2011 | Goldfarb et al. |
| 2007/0194804 | A1 | 8/2007 | Kase et al. |
| 2008/0024229 | A1 | 1/2008 | Dupuis et al. |
| 2009/0088124 | A1 | 4/2009 | Schuur et al. |
| 2009/0176467 | A1 * | 7/2009 | Im et al. ..................... 455/182.1 |
| 2010/0301943 | A1 | 12/2010 | Goldfarb |
| 2011/0279147 | A1 | 11/2011 | Montalvo et al. |
| 2012/0149321 | A1 | 6/2012 | Montalvo et al. |

OTHER PUBLICATIONS

WiMAX RF MxFE Transceiver: AD9352-5. Datasheet [online]. Analog Devices, Inc., Oct. 2008 [retrieved on Jan. 23, 2013]. Retrieved from the Internet: <URL: http://www.analog.com/static/imported-files/data_sheets/AD9352-5_2_Page.pdf>.

WiMAX RF MxFE™ Transceiver: AD9353. Datasheet [online]. Analog Devices, Inc., Oct. 2007 [retrieved on Jan. 23, 2013]. Retrieved from the Internet: <URL: http://www.analog.com/static/imported-files/data_sheets/AD9353.pdf>.

WiMAX/WiBRO RF MxFE™ MISO Transceiver AD9354. Datasheet [online]. Analog Devices, Inc., Mar. 2009 [retrieved on Jan. 23, 2013]. Retrieved from the Internet: <URL: http://www.analog.com/static/imported-files/data_sheets/AD9354.pdf>.

WiMAX Rf MxFE™ Transceiver: AD9355. Datasheet [online]. Analog Devices, Inc., Apr. 2009 [retrieved on Jan. 23, 2013]. Retrieved from the Internet: <URL: http://www.analog.com/static/imported-files/data_sheets/AD9355.pdf>.

WiMAX/BWA/WiBRO/LTE RF MxFE 2 × 2 MIMO Transceiver: AD9356. Datasheet [online]. Analog Devices, Inc., Jan. 2010 [retrieved on Jan. 23, 2013]. Retrieved from the Internet: <URL: http://www.analog.com/static/imported-files/data_sheets/AD9356.pdf>.

WiMAX/BWA/LTE RF MxFE 2 × 2 MIMO Transceiver. AD9357. Datasheet [online]. Analog Devices, Inc., Apr. 2010 [retrieved on Jan. 23, 2013]. Retrieved from the Internet: <URL: http://www.analog.com/static/imported-files/data_sheets/AD9357.pdf>.

Gilbert, Barrie. The Micromixer: A Highly Linear Variant of the Gilbert Mixer Using a Bisymmetric Class-AB Input Stage, IEEE Journal of Solid-State Circuits, vol. 32, No. 9, Sep. 1997, pp. 1412-1423.

* cited by examiner

APPARATUS AND METHOD FOR A WIDEBAND RF MIXER

BACKGROUND

1. Field

Embodiments of the invention relate to electronic devices, and more particularly, to RF mixers.

2. Description of the Related Technology

Certain electronic systems, such as receivers, transmitters, and transceivers, can include a mixer for down converting a high frequency signal (for example, a received radio frequency signal) to a lower frequency signal (often referred to as an intermediate frequency signal) or for up converting a low frequency signal to a high frequency signal (for example, a radio frequency signal to be transmitted). For example, such a mixer may be installed in a variety of devices using wireless technology, such as cellular telephones and mobile devices and hand-held devices, cellular towers, GPS units, satellites, etc.

In many electronic systems that include mixers, fixed tuning elements may include a matching network at one of a radio-frequency port or an intermediate-frequency port to provide relatively well-matched impedances at an input to the mixer or an output of the mixer for the desired signals and other impedances to mismatch other undesired signals at the input or output.

SUMMARY

An embodiment of the invention can simultaneously provide matched impedances for desired signals so that, for example, the desired signals can be translated from the RF input to the IF output with relatively low conversion loss while simultaneously providing a mismatched impedance to undesired signals that could otherwise degrade the performance of the receiver.

One embodiment includes an apparatus, wherein the apparatus includes: an input configured to receive an input signal; a local oscillator (LO) input configured to receive an LO signal; a passive radio-frequency (RF) mixer configured to generate an output signal based at least partly on the input signal and the LO signal; an output configured to provide the output signal; an input path variable impedance tuner operatively coupled to and disposed in a first signal path between the input and the passive RF mixer; and an output path variable impedance tuner operatively coupled to and disposed in a second signal path between the RF mixer and the output, wherein an impedance of the input impedance tuner at one or more input frequencies of operation and an impedance of the output impedance tuner at one or more output frequencies of operation are controllable by one or more control signals.

One embodiment includes a method of adjusting impedances for a change in frequency of operation, the method including: during operation, tuning an impedance of an input path variable impedance tuner operatively coupled to and disposed in a first signal path between an input and an RF mixer, wherein the input is configured to receive an input signal and the RF mixer configured to generate an output signal at an output based at least partly on the input signal and a local oscillator (LO) signal input received at an LO input using one or more control signals; and during operation, tuning an impedance of an output path variable impedance tuner operatively coupled to and disposed in a second signal path between the RF mixer and the output using the one or more control signals.

One embodiment includes an apparatus, the apparatus including: an input configured to receive an input signal; a local oscillator (LO) input configured to receive an LO signal; a radio-frequency (RF) mixer configured to generate an output signal based at least partly on the input signal and the LO signal; an IF output configured to provide the IF signal as an output; input path tuning means for providing a controllable variable impedance using one or more control signals, the input path tuning means operatively coupled to and disposed in a first signal path between the RF port and the RF mixer; and output path tuning means for providing a controllable variable impedance using the one or more control signals, the output path tuning means operatively coupled to and disposed in a second signal path between the RF mixer and the IF port.

One embodiment includes an apparatus, the apparatus including: an input configured to receive an input signal; a local oscillator (LO) input configured to receive an LO signal; a radio-frequency (RF) mixer configured to generate an output signal based at least partly on the input signal and the LO signal; an IF output configured to provide the IF signal as an output; input path tuning means for providing a controllable variable impedance at both the input frequency and a different variable impedance at an unwanted frequency using one or more control signals, the input path tuning means operatively coupled to and disposed in a first signal path between the RF port and the RF mixer; and output path tuning means for providing a controllable variable impedance using the one or more control signals, the output path tuning means operatively coupled to and disposed in a second signal path between the RF mixer and the IF port such that the output path tuning means simultaneously passes the desired input signal and rejects an unwanted input signal.

BRIEF DESCRIPTION OF THE DRAWINGS

FIGS. 3A1-3B2 and 3C-3I illustrate various embodiments of a variable impedance tuner.

DETAILED DESCRIPTION OF CERTAIN EMBODIMENTS

The following detailed description of certain embodiments presents various descriptions of specific embodiments of the invention. However, the invention can be embodied in a multitude of different ways as defined and covered by the claims. In this description, reference is made to the drawings in which like reference numerals indicate identical or functionally similar elements.

Overview of Wideband Mixers with Variable Impedance Tuners

Figure 1A:
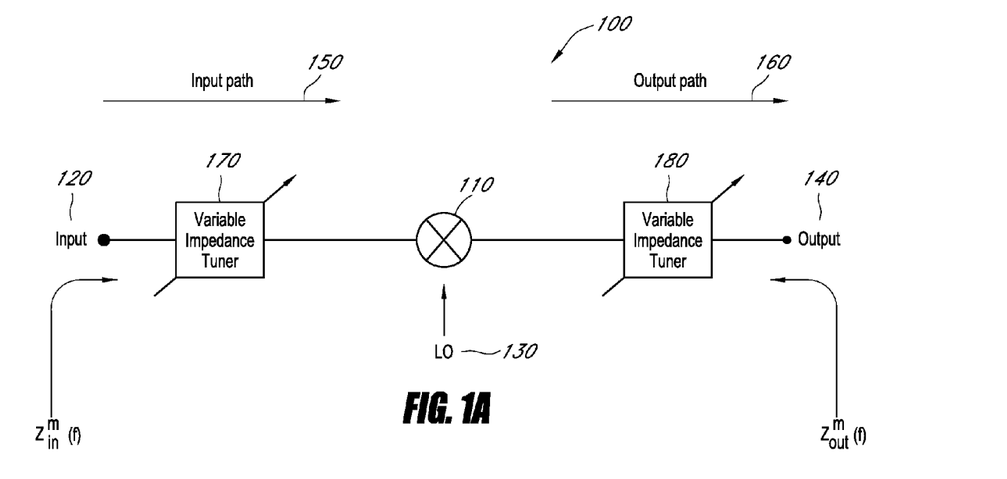
FIG. 1A illustrates a schematic diagram of an electronic system with a wideband mixer according to an embodiment of the invention.

FIG. 1A is a schematic diagram of an electronic system 100 having a mixer 110, an input 120 for receiving a signal to be mixed, a local oscillator (LO) input 130 for receiving a local oscillator signal, and an output 140 for providing a frequency-mixed signal as an output. The output can be provided to a subsequent stage of electronics, such as to a demodulator for a receiver or to an amplifier for a transmitter. The electronic system 100 is configured to be a wideband mixer that can perform well in multiple frequency ranges. The electronic system 100 includes an input variable impedance tuner 170 disposed along an input path 150 and an output variable impedance tuner 180 disposed along an output path 160. The variable impedance tuners 170, 180 can be controlled among two or more different impedance configurations. In each configuration, the impedance of the variable impedance tuner 170 can combine with other impedances in the electronic system 100, such as the impedance of the mixer 110 or the impedance of the other variable impedance tuner 180, to present a given input impedance $Z_{in}{}^m(f)$, in which parameter m denotes that more than one input impedance is possible, and f denotes that the input impedance can be frequency dependent.

Similarly, in each configuration, the impedance of the variable impedance tuner 180 can combine with other impedances in the electronic system 100, such as impedance of the mixer 110 or the impedance of the other variable impedance tuner 170, to present a given output impedance $Z_{out}{}^n(f)$, in which n denotes that more than one output impedance is possible, and f denotes that the output impedance can be frequency dependent.

Variable impedance tuners 170, 180 can be useful because after a wavelength of a signal becomes short enough that it is of a comparable size as a signal path on which the signal travels, lumped-element circuit theory begins to become incomplete. As a result, transmission-line theory is also used for design and analysis. Performance is improved when the impedance at the input of an input device is matched with the complex conjugate of the output impedance of the device that provides a signal to the input of the input device. The input and output impedances are often selected to be fifty (50) ohms, however, depending upon the application, the impedance can vary. For example, an antenna (not shown in FIG. 1A) may receive an RF signal from the ambient environment. The antenna may feed the RF signal to an amplifier (also not illustrated in FIG. 1A). The amplifier, in turn, may feed the amplified RF signal to the input 120 of the mixer 110. When the output impedance of the amplifier, or the antenna and the amplifier together, is equal to $Z_{amplifier, out}$, then it is typically desirable for the mixer 110 present an input impedance, $Z_{RF, in}$, similar to the complex conjugate of $Z_{out}$. For example, when the mixer 110 alone does not present a suitable input impedance, an impedance matching network (similar to variable impedance tuners 170, 180) comprising various impedance elements (including, for example, resistors, capacitors, inductors, or transmission line stubs) may be placed in series or in shunt at the input 120 to allow for a better impedance match. Typically, these impedance matching networks are static and have a narrow frequency band of operation. The operating frequency band of a static impedance matching is typically narrow because the impedance characteristics of many impedance elements vary over frequency. However, a wide-band mixer is desirable. For a wide-band mixer, a controllably configurable impedance matching network, such as input and output variable impedance tuners 170, 180, may allow the mixer to present a relatively good input or output impedance for multiple frequency bands. In addition to simply providing relatively good impedances to provide efficient power transfer, it is possible to adjust these frequency dependent impedances to enhance or reject other frequencies adjacent to the desired frequencies. The reciprocal nature of the passive mixer can make it desirable to implement this adjustment at the RF output, which is then reflected to the input port of the mixer through the frequency translation (mixing) action of the mixer.

Figure 1B:
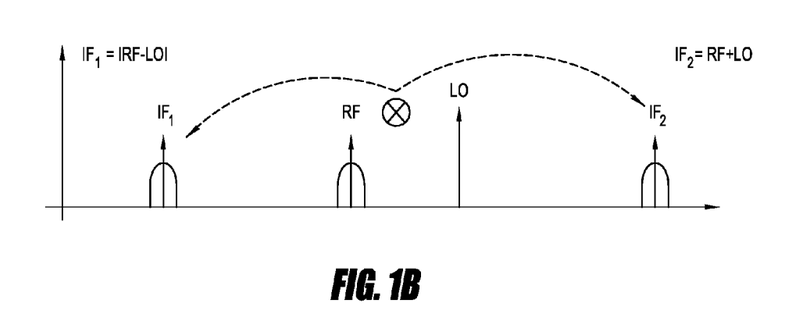
FIGS. 1B and 1C illustrate graphs showing the frequencies of operation of a wideband mixer.

FIG. 1B is a graph showing the frequencies of operation of the mixer 110 (FIG. 1A) for an embodiment in which the mixer 110 is performing down conversion so the signal at the input 120 is an RF signal. The RF signal may include, for example, many signals at multiple RF frequencies. For example, the signal at the input 120 can come from an antenna receiving multiple signals. It is desirable to present an appropriate input impedance $Z_{in}{}^m(f)$ at a particular RF frequency of interest. When performing down conversion, the mixer 110 mixes the RF signal at the input 120 with the LO signal to generate multiple signals at the output 140 at multiple frequencies known as beat frequencies. The signal at the output 140 may be referred to as an intermediate frequency (IF) signal. As illustrated in FIG. 1B, the fundamental frequencies provided by the mixer 110 at the output 140 may include the fundamental sum frequency (LO+RF) as well as the absolute value of the fundamental difference frequency (|LO−RF|). However, higher-order beat frequencies are also possible. For example, in general, the mixer 110 can produce a number of beat frequencies at various frequencies as expressed by the Equation 1.

$$|i \cdot RF \pm j \cdot LO| \qquad \text{Eq. 1}$$

In Equation 1, i and j can be any integer greater than or equal to 1. When the mixer 110 performs down conversion, the mixed signal can be either (1) the absolute value of a harmonic difference of the RF frequency and the LO frequency or (2) a harmonic sum of the RF and the LO frequencies. For example, if the RF signal is centered around a frequency of 0.9 GHz (900 MHz) and the LO frequency is 1.4 GHz, the IF signal provided at the output 140 may include signals with center frequencies at 0.4, 0.5, 1, 1.3, 1.9, 2.3, 3.2, 3.3, 3.7, 4.1, 4.6, 5.1, GHz, etc., as illustrated in Table I.

TABLE I

| i | j | i · RF + j · LO | i · RF − j · LO |
|---|---|---|---|
| 1 | 1 | 2.3 GHz | 0.5 GHz |
| 1 | 2 | 3.7 | 1.9 |
| 1 | 3 | 5.1 | 3.3 |
| 2 | 1 | 3.2 | 0.4 |
| 3 | 1 | 4.1 | 1.3 |
| 2 | 2 | 4.6 | 1 |

As can be seen from the above, the mixer 110 may operate at any, or all, of the RF frequency, the LO frequency, and any of the beat frequencies determined by equation 1. Hence, the frequencies of operation of the mixer 110 may be very large. As a result, the impedance presented at the input 120, for example, may be different for each of these frequencies of operation. The impedance presented at the output 140 may also be different for each of the multiple frequencies of operation. In some situations, the signal of interest at the output may be the lower sideband. That is, the signal of interest may often be the signal at a frequency band about |RF−LO|. More generally, a lower sideband may be any signal at a frequency band about any one of the difference beat frequencies (for example, any of |i·RF−j·LO|). However, any of the operation frequencies may be of particular interest, depending upon the particular application.

Figure 1C:
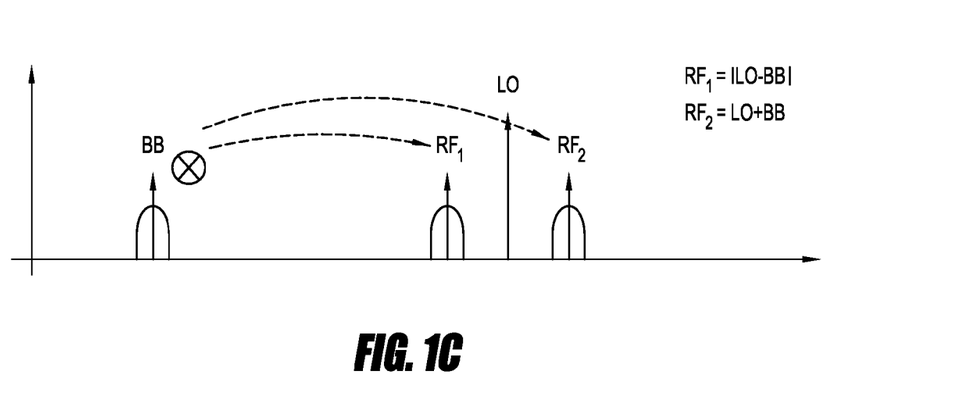

FIG. 1C is a graph showing the frequencies of operation of the mixer 110 when the signal at the input 120 is a baseband (BB) signal and the mixer 110 is performing up conversion of the baseband signal to an RF signal. Hence, in some embodiments, the mixer 110 mixes a baseband input signal at the input 120 to generate an RF signal at the output 140. As illustrated in FIG. 1C, the fundamental frequencies provided by the mixer 110 at the output 140 may include both a difference frequency (LO−BB) as well as a sum frequency (LO+BB). However, higher order beat frequencies are also possible. For example, in general, the mixer 110 may generate, based at least partly on the baseband and the LO input signals, multiple signals with center frequencies at beat frequencies determined by Equation 2.

$$|i \cdot LO \pm j \cdot IF| \quad \text{Eq. 2}$$

Returning now to FIG. 1A, it is noted that some mixers may be capable or configured to perform both down conversion as well as up conversion. One example of such a mixer is a passive mixer. Some characteristics of passive mixers include that there is little or no DC (or standing) current and there is little or no power gain. Another characteristic of passive mixers is that impedance matching elements disposed at one side of the mixer can influence the impedance on the other side of the mixer. Therefore, the input variable impedance tuner 170 shown in FIG. 1A can influence the output impedance, $Z_{out}''(f)$, at the output 140 and the output variable impedance tuner 180 can influence the input impedance, $Z_{in}'''(f)$, at the input 120.

Wideband Mixers with Variable Impedance Tuners Having an RF Input

Figure 2A:
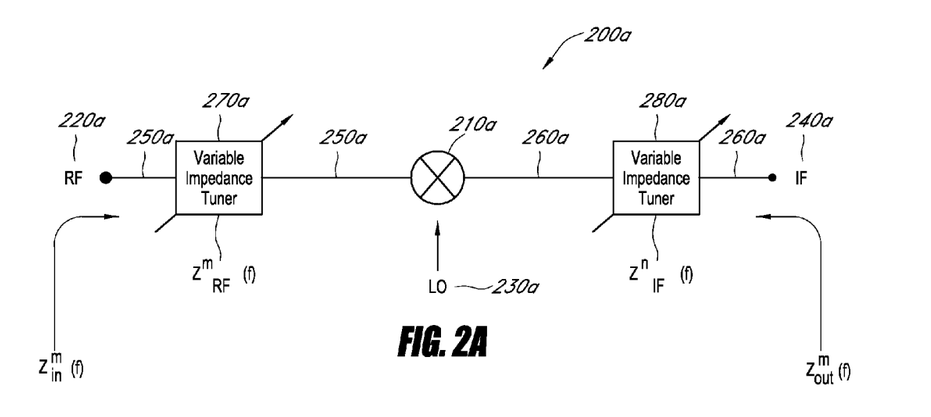
FIGS. 2A and 2B illustrate schematic diagrams of electronic systems with a wideband mixer in accordance with various embodiments.

FIG. 2A is a schematic diagram of an electronic system 200a with a wideband mixer in accordance with one embodiment. As shown in FIG. 2A, electronic system 200a includes a mixer 210a and has an RF input 220a, an LO input 230a, and an IF output 240a. The electronic system 200a also includes an input path variable impedance tuner 270a in a first signal path 250a between the RF input 220a and the mixer 210a as well as an output path variable impedance output tuner 280a in a second signal path 260a between the IF output 240a and the mixer 210a. In some embodiments, variable impedance input tuner 270a and variable impedance output tuner 280a may each be independently capable of controllably (using digital or analog signals) having two or more distinct impedance at one or more frequencies of operation. Various embodiments of the variable impedance tuners 270a, 280a and the controllability of the variable impedance tuners will be described with reference to FIGS. 3A-3I.

Variable impedance input tuner 270a is capable of controllably having a first impedance and a second impedance at a given frequency, and variable impedance output tuner 280a is capable of controllably having a third impedance and a fourth impedance at the given frequency or at another given frequency. Some of these four impedances may be the same or different. In some embodiments, variable impedance input tuner 270a and output tuner 280a may each be independently capable of controllably having a different number of distinct impedances at a given frequency of operation. For example, variable impedance input tuner 270a may be capable of having m number of distinct impedances at a given frequency of operation and variable impedance output tuner 280a may be capable of having n number of distinct impedances at a given frequency of operation, where m and n are positive integers greater than or equal to one. In some embodiments, m and n are positive integers that are two or greater. Also, in some embodiments, input path variable impedance tuner 270a and output path variable impedance tuner 280a may each be independently capable of having a single impedance, but at two different frequencies. In other words, input path variable impedance tuner 270a may be capable of being configured to have a first impedance at a first frequency of operation, and also be tuned or configured to keep the same first impedance at a second frequency of operation. Similarly, output path variable impedance tuner 280a may be capable of being tuned or configured to have a second impedance at the first frequency of operation, and also be tuned or configured to keep the same second impedance at the second frequency of operation. The tuning or configuration of input and output path variable impedance tuners 270a, 280a can be controlled using analog or digital signals. In this way, the variable impedance tuners 270a, 280a may overcome the frequency dependence often associated with fixed impedance matching networks.

With continued reference to FIG. 2A and as just noted, the variable impedance tuners 270a and 280a can each be independently capable of controllably having two or more impedances. Hence, the impedance of each of the input path variable impedance tuner 270a and output path variable impedance tuner 280a may combine with other impedances in the electronic system 200a, including the impedance of the mixer 210a, so as to present a first desired impedance at the RF input 220a, or a desired input impedance, and a second desired impedance at the IF output 240a, or a desired output impedance. The variable impedance tuners 270a and 280a may be capable of presenting the desired input and output impedances at given frequencies of operation, and may be tunable to adjust their impedances in order to also present the same or different desired input impedance and the same or different output impedances at other, different frequencies of operation. For example, the variable impedance tuners 270a and 280a may each be independently capable of having desired impedances so that the wideband electric system 200a presents a first desired input impedance at a first input frequency, $Z_{in}^1(f_{in,1})$, and a first desired output impedance at a first output frequency, $Z_{out}^1(f_{out,1})$. In the embodiment being discussed here, the input frequency is an RF frequency and the output frequency is an IF frequency. Furthermore, the variable impedance tuners 270a and 280a may also each be independently capable of having other desired impedances that may then combine with other impedances in an electronic system, so that the wideband electronic system 200a presents a second desired input impedance at a second input frequency, $Z_{in}^2(f_{in,2})$, and a second desired output impedance at a second output frequency, $Z_{out}^2(f_{out,2})$. In some embodiments, the desired input impedance and output impedance are both equal to about fifty (50) ohms at the relevant frequencies. In other embodiments, the impedances are both equal to about seventy-five (75) ohms. Other impedances may be applicable, depending upon the application, and readily determined by one of ordinary skill in the art.

As the input path variable impedance tuner 270a and the output path variable impedance tuner 280a may be adjusted to have more than one distinct impedance, the input path variable impedance tuner 270a and the output path variable impedance tuner 280a may be configured to be capable of presenting two or more different desired input impedances at the input 220a at an RF frequency band, $Z_{in}^m(f_{RF})$, and two or more distinct desired output impedances at the output 240a at an IF frequency band, $Z_{out}^n(f_{IF})$, where m and n are integers to denote the possibility of more than one desired input and/or output impedance. Therefore, for example, in one embodiment, the frequency of operation may be 900 MHz, and the input path variable impedance tuner 270a may be controlled to present a 50 ohm input impedance at 900 MHz in one configuration and a 75 ohm input impedance at 900 MHz in another configuration. Similarly, the output path variable impedance tuner 280a may be controlled to present a 50 ohm output impedance at a desired IF frequency in one configuration and a 75 ohm output impedance at the desired IF frequency in another configuration. The desired IF frequency may depend upon the LO frequency and the upper or lower sideband of interest, as discussed with reference to FIGS. 1A and 1B.

With continued reference to FIG. 2A, it is noted that the impedance of an impedance element can be frequency dependent. As such, when the input path variable impedance tuner 270a is set to have a first desired impedance for a first band of operation frequencies, and the output path variable impedance tuner 280a is set to have a second desired impedance, the impedance may only be at the desired values for a first band of operation frequencies. At frequencies outside of the first band of operation frequencies, the impedances of the input path variable impedance tuner 270a and the output path variable impedance tuner 280a may no longer be at the first and second desired impedance, and as such, the input and output impedances may no longer be at an optimal level. For example, some RF systems and circuits are selected to have an input and output impedance of fifty (50) ohms. If the input path variable impedance tuner 270a and the output path variable impedance tuner 280a are tuned such that the electronic system 200a presents fifty (50) ohms at the input 220a at a first RF frequency and fifty (50) ohms at the output 240a at a first IF frequency, then at different operation frequencies, the electronic system 200a may present a different, non-optimal impedance at the input 220a and the output 240a. Hence, it may be useful to tune, reconfigure, or adjust, the impedance of input path variable impedance tuner 270, $Z_{RF}^{m}(f)$, and the impedance of output path variable impedance tuner 280, $Z_{IF}^{n}(f)$. This way, at a second RF frequency, the electronic system 200a also presents fifty (50) ohms at the input 220a at the second RF frequency and fifty (50) ohms at the output 240a at the second IF frequency. Hence, if the mixer 210a is configured to operate at two or more RF frequencies of operation, the input path variable impedance tuner 270a and output path variable impedance tuner 280a may help to improve the performance of the electronic system 200a at the two or more RF frequencies of operation. It is understood that when discussing more than one RF frequency of operation, strictly speaking, this may actually refer to more than one RF operation frequency bands.

In some embodiments, the first and the second RF frequency bands can be two different frequency bands. For example, the first RF frequency band may be a band centered on one of the commonly used RF center frequencies, such as, 450 MHz, 800 MHz, 850 MHz, 900 MHz, 1800 MHz, and 1900 MHz. The second RF frequency band may be a band selected from these commonly used RF bands that are different from the first RF frequency band. As noted above, the first IF frequency generated by the RF mixer can correspond to the absolute value of the difference between the LO frequency provided to the RF mixer and the first RF frequency, and the second IF frequency may include the absolute value of the difference between the LO frequency and the second RF frequency. The difference frequency can correspond to the fundamental difference harmonic, or higher order difference harmonics.

In other embodiments, the first and second RF frequency bands may include any band chosen from the RF ranges of 806-960 MHz, 1710-2025 MHz, 2110-2200 MHz, and 2500-2590 MHz. The first and second RF frequency bands may be different from each other, but may be chosen from the same range. For example, the first RF frequency band may be 1800 MHz and the second RF frequency may be 1900 MHz, even though both of these different frequency bands are from the same range of frequencies, namely, 1710-2025 MHz. The first and second IF frequencies, as discussed above, may include one harmonic difference between the LO frequency the relevant RF frequency.

In the example discussed above, the input path variable impedance tuner 270a and output path variable impedance tuner 280a are tuned to present an impedance of fifty (50) ohms at input 220a at both the first and second RF frequency and to present an impedance of fifty (50) ohms at the output 240a at both the first and second the second IF frequency. However, in some embodiments, the characteristics of the input path variable impedance tuner 270a and the output path variable impedance tuner 280a are independently controllable so that, in combination, the electronic system 200a presents a first desired impedance at the input 220a at the first RF frequency and a second desired impedance at the output 240a at the first IF frequency. Furthermore, the characteristics of the input path variable impedance tuner 270a and the output path variable impedance tuner 280a may be independently controllable so that, in combination, the electronic system 200a presents a third desired impedance at the input 220a at the second RF frequency and a fourth desired impedance at the output 240a at the second IF frequency. The first, second, third, and fourth desired impedances may each be different, or the same. Some RF systems are matched at fifty (50) ohms, while other systems are matched at about seventy-five (75) ohms. In some cases, at a certain IF frequency for example, the desired impedance may be low, for example, less than five (5) ohms or quite high, such as, greater than 1000 ohms. One or more of the first, second, third, and fourth desired impedances may therefore be fifty (50), seventy-five (75), five (5) ohms, or more than one thousand (1000) ohms. Applicable values of impedance will be readily determined by one of ordinary skill in the art.

With continued reference to FIG. 2A, in some embodiments, the frequencies (or bands of frequencies) of operation may comprise an RF frequency, a lower sideband comprising a difference between an LO frequency and the RF frequency, and an upper sideband comprising a sum of the LO frequency and the RF frequency. In such an embodiment, the input path variable impedance tuner 270a and the output path variable impedance tuner 280a may each be independently and controllably tuned to have a desired impedance at each of the RF frequency, the lower sideband frequency and the upper sideband frequency. For example, in one embodiment, the impedances of the input path variable impedance tuner 270a and the output path variable impedance tuner 280a may be configured to be controlled to present a first desired input impedance at the input 220a at the RF frequency and a low impedance at the input 220a for both the lower sideband and the upper sideband, while also presenting a second desired impedance at the output 240a at the lower sideband and a low impedance at the IF port at the upper sideband. In this way, the input path variable impedance tuner 270a and output path variable impedance tuner 280a may be impedance matched for the lower sideband at the output 240a, which can be the fundamental lower sideband, or any of the higher order lower sidebands. In other embodiments, the input path variable impedance tuner 270a and the output path variable impedance tuner 280a may be impedance matched for an upper sideband at the output 240a, which can be a fundamental upper sideband, or any of the higher order upper sidebands. In some embodiments, the first and second desired impedances can be different. In other embodiments, the first and second desired impedances can each be about fifty (50) or seventy-five (75) ohms. Other applicable values for impedance will be readily determined by one of ordinary skill in the art. In some embodiments, the low impedance may be below about five (5)

ohms. In one embodiment, the impedance can be varied from about 1/10 of the operating impedance to about 10 times the operating impedance.

Figure 2B:
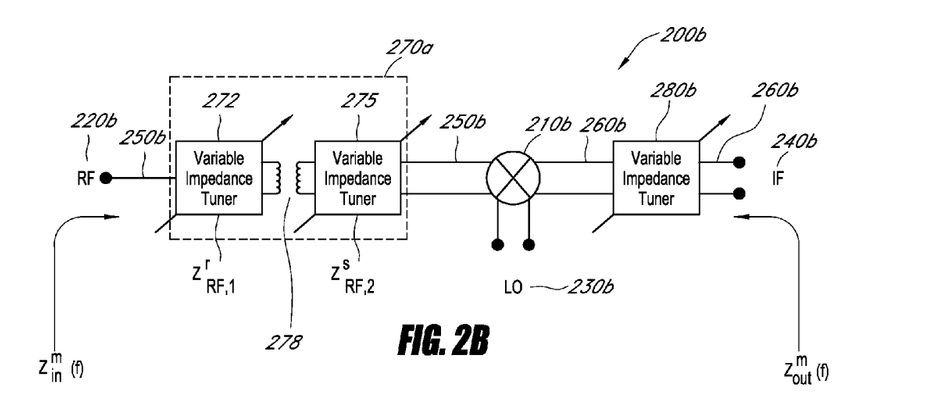

FIG. 2B is a schematic diagram of an electronic system with a wideband mixer in accordance with another embodiment. In the embodiment shown in FIG. 2B, the electronic system 200b the input path variable impedance tuner 270a of FIG. 2A comprises first and second input path variable impedance sub-tuners 272, 275 and a balun transformer 278. As illustrated, the input is an RF input 220b and the output is a differential IF output 240b. Also, the LO input 230b in FIG. 2B is a differential input into mixer 210b which mixes the RF and LO signals to generate a differential IF signal at the IF output 240b. The balun transformer 278 is useful in applications in which the RF signal input at the RF input 220b is a single-ended signal, and conversion to a differential signal is desired. Also, the balun transformer 278 may be operatively coupled to and disposed in the first signal path 250b between the first input path variable impedance sub-tuner 272 and the second input path variable impedance sub-tuner 275. The combination of the first input path variable impedance sub-tuner 272, the second input path variable impedance tuner 275, and the balun transformer 278 operate in a way similar to the single input path variable impedance tuner 270a of FIG. 2A. In particular, each of the first input path variable impedance sub-tuner 272 and the second input path variable impedance tuner 275 may be controlled by one or more control signals to have two or more desired impedances, labeled for convenience as $Z_{RF,1}^{r}(f)$ and $Z_{RF,2}^{s}(f)$, where r and s indicate that the impedances may be controlled to have two or more values. The impedances contributed by the first input path variable impedance sub-tuner 272 and second input path variable impedance tuner 275 may then combine with other impedances in the electronic system 200b, including the impedance of the mixer 210b and the output path variable impedance tuner 280b, so as to present a given input impedance, $Z_{in}^{m}(f)$, at the RF input 220b. Similarly, the impedance contributed by the output path variable impedance tuner 280b may combine with other impedance in the electronic system 200b, including the mixer and sub-tuners 272 and 275, so as to present a given output impedance, $Z_{out}^{n}(f)$, at the output 240b.

With continued reference to the embodiment of FIG. 2B, it is noted that in view of the single-ended to differential conversion accomplished by the balun transformer 278, the output 240b is illustrated as a differential output. However, depending upon the application, the IF signal may be presented as a single-ended signal at the output 240b. For a single-ended signal at the output 240, a balun transformer may be operatively coupled to and disposed in the second signal path 260b. In such an embodiment, it is possible for two IF sub-tuners to be present in the signal path, in a way similar to sub-tuners 272 and 275 with an IF balun transformer disposed in between.

With continued reference to FIGS. 2A-2B, in some embodiments, the mixer 210a may be a passive mixer. Various embodiments of the mixer 210 are discussed below with reference to FIGS. 4A-4D. Furthermore, in one embodiment, the mixer 210 and the impedance tuners 270 and 280 (or impedance sub-tuners 272, 275) can all be embodied in an integrated circuit, such as a monolithic integrated circuit. A single substrate assembly can include the substrate on which the mixer 210 is formed. Alternatively, the mixer 210 can be formed on a substrate and packaged as a mountable chip, where the package is then mounted onto the single substrate on which the sub-tuners 270 (272, 275) and 280 may be formed. Alternatively, two or more of the impedance tuners 270 and 280 (or impedance sub-tuners 272, 275) can be formed on separate substrates and packaged as a mountable chip. The mountable chip input impedance tuner and/or output impedance tuner may then be mounted on a single substrate onto which the mixer 210 is formed, or onto which the mixer 210 (also packaged as a mountable chip) is mounted.

Variable Impedance Tuners

FIGS. 3A-3I illustrate various embodiments of a variable impedance tuner, such as tuners 270a, 272, 275, 280a, 280b illustrated in the embodiments of FIGS. 2A-2B. The various embodiments of FIGS. 3A-3I are not mutually exclusive, as some of these embodiments overlap in scope with other embodiments. Also, it is understood that while input path variable impedance tuner 270a (FIG. 2A) may include, for example, one of the embodiments of FIGS. 3A-3I, output path variable impedance tuner 280a may not include the same embodiment, but another one of the embodiments of FIGS. 3A-3I. In other words, variable impedance tuners 270, 272, 275, 280 may be different from each other.

Figure 3A:
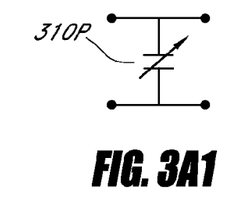
Figure 3A:
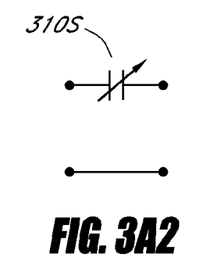

In the embodiment of FIG. 3A1, the variable impedance tuner comprises a shunt variable capacitor 310p, while in the embodiment of FIG. 3A2, the variable impedance tuner comprises a series variable capacitor 310s. The variable capacitors 310p, 310s may be controlled by analog or digital signals to allow the variable capacitor to have two or more different capacitances. For example, in some embodiments, the variable capacitor 310p, 310s may comprise a varactor diode structure whose capacitance is a function of an applied control voltage. Techniques to isolate the control voltage from signals are well known in the art. The applied control voltage may be an analog control that controls the value of the capacitance of the variable capacitor 310p, 310s, but the circuitry that controls the value of the applied control voltage may include analog or digital circuitry. The varactor diode may include, for example, a MOS diode or a Schottky diode. Alternatively, the variable capacitor may include an array of capacitors, where groups of one or more capacitors in the array are connected with other capacitors in the array with switches (e.g., transistors) that can be switched open or closed.

Figure 3B:
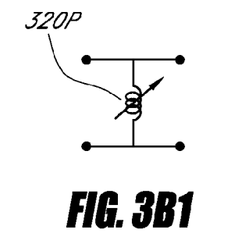
Figure 3B:
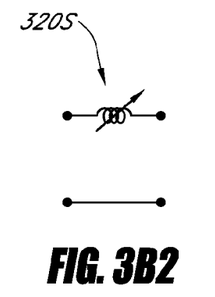

With reference to the embodiments of FIGS. 3B1 and 3B2, the variable impedance tuner may comprise a variable inductor such as shunt inductor 320p (FIG. 3B1), or series inductor 320s (FIG. 3B2). The variable inductor 320p, 320s may be controlled by analog or digital signals to allow the variable inductor 320p, 320s to have two or more different inductances.

Figure 3C:
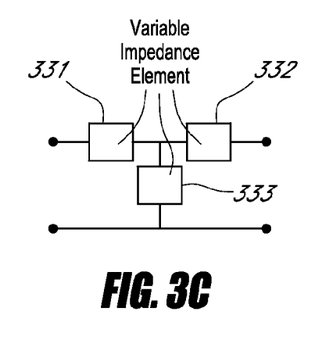

In addition, a variable impedance tuner may include more than one variable impedance element connected in series or in shunt for added flexibility in the variability of the impedance. The variable impedance elements may include such elements as the variable capacitor 310p, 310s of FIG. 3A or the variable inductor 320p, 320s of FIG. 3B. As shown in FIG. 3C, the variable impedance tuner may include an element in series, such as element 331 and/or 332, as well as an element connected in shunt, such as element 333. As shown in the illustrated embodiment, the element connected in shunt, element 333, is connected to a signal node connecting element 331 and element 332. While three elements are shown in FIG. 3C, any number of variable impedance elements may be connected in an array. Also, while two elements are illustrated as connected in series, any number of variable impedance elements may be connected in series. Further, the number of elements connected in shunt need not be limited to one. In some embodiments, two or more variable impedance elements are connected in shunt.

Figure 3D:
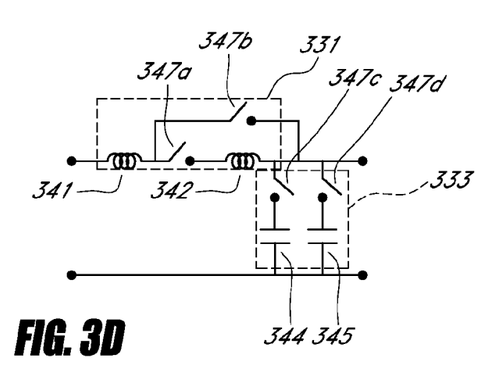

With reference now to FIG. 3D, one embodiment of an LC impedance-matching network comprising both a variable capacitance capacitor and a variable inductance inductor is shown. In FIG. 3D, a variable impedance element 331 connected in shunt with another variable impedance element 333 is shown. Variable impedance element 331 is shown including two inductors connected in series. The two inductors 341, 342 are connected with switches 347a, 347b. The switches are configured so as to allow the selection of inductor 341 alone, or inductor 341 in series with 342. In this way, element 331, as illustrated, allows for the selection of two different inductances. In other embodiments, additional switches (such as switches 347a, 347b) may be used and configured to allow the selection of inductor 341 alone (selection of inductor 342 alone not possible in illustrated embodiment), inductor 342 alone, or the inductors 341 and 342 in series (whose total inductance would then be equal to the sum of the inductances of inductor 341 and 342). If inductors 341 and 342 have different inductance values, such a configuration may allow for the selection of three different inductances. With more inductors and more switches, a greater number of selectable inductances may be possible.

With continued reference to the embodiment illustrated in FIG. 3D, the variable impedance element 333 is shown connected in shunt. The illustrated variable impedance element 333 includes two capacitors 344, 345 connected in parallel, with each capacitor connected in series with switches 347c, 347d. When both the capacitors 344, 345 are switched on, then the total capacitance of the combination is equal to the sum of the capacitance of the capacitor 344 and the capacitor 345. Hence, if the capacitors 344, 345 have different amounts of capacitance, then the illustrated embodiment is capable of having three different amounts of capacitance. In this way, as illustrated, the variable impedance tuner of FIG. 3D may be capable of having six different impedances. By connecting a variable inductor and a variable capacitor in ways different from that illustrated in FIG. 3D, other embodiments of LC impedance-matching networks are possible.

Figure 3E:
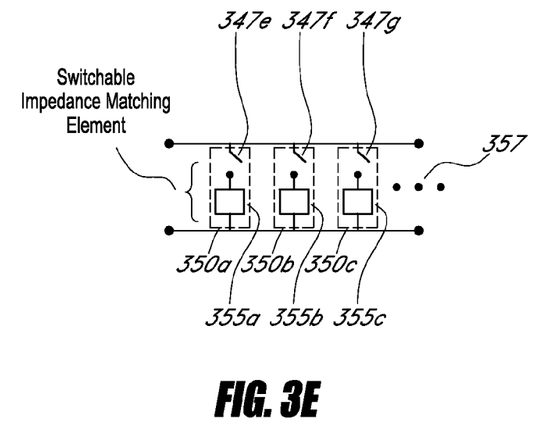
Figure 3F:
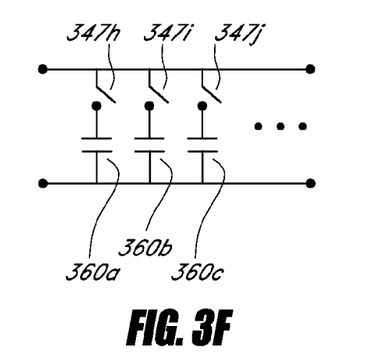

With reference now to FIG. 3E, some embodiments of a variable impedance tuner include an array of two or more switchable impedance-matching elements 350a, 350b, 350c. In the illustrated embodiment, each switchable impedance matching element 350a, 350b, 350c includes a switch 347e, 347f, 347g connected in series with an impedance matching element 355a, 355b, 355c. As illustrated, three switchable impedance matching elements 350a, 350b, 350c are connected together in parallel. The impedance matching elements 355a, 355b, 355c may comprise one or more of a capacitor, an inductor, an open or shorted transmission line (of a given length, e.g., ¼λ), and/or an inductor connected in series or in parallel with a capacitor. Given that the switchable impedance matching elements are connected in series with a switch 347e, 347f, 347g, when a particular switch 347e, 347f, 347g is closed, then the impedance matching element connected to the switch is part of the circuit and the switchable impedance matching element may contribute to the overall impedance of the tuner. Hence, the switches 347e, 347f, 347g may be switched open or closed thereby rendering the variable impedance tuner controllably capable of having two or more different impedances. As illustrated, if each of the elements 355a, 355b, 355c has a different impedance, then the tuner may be capable of having three or more distinct impedances. However, as indicated by the dotted lines 357, the variable impedance tuner may include more than three switchable impedance matching elements 350a, 350b, 350c. Alternatively, the variable impedance tuner may include only one switchable impedance element or only two switchable impedance elements.

With continued reference to FIG. 3E, in some embodiments of the variable impedance tuner, impedance matching elements 355a, 355b, and 355c may include different kinds of impedance matching elements. For example, in one embodiment element 355a can have a capacitor and no inductor, while element 355b has an inductor but does not have a capacitor. Also, in embodiments in which an electronic system includes more than one variable impedance tuner, it is understood that the variable impedance tuners may differ from one another in a number of the switchable impedance matching elements or in the kind of the switchable impedance matching element. For example, the switchable impedance matching elements of one of the variable impedance tuners may include capacitors in series with a switch, while the switchable impedance matching elements of the other variable impedance tuner may include only an inductor, but not capacitor, in series with a switch.

Figure 3G:
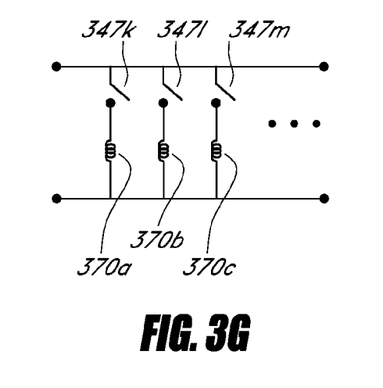
Figure 3H:
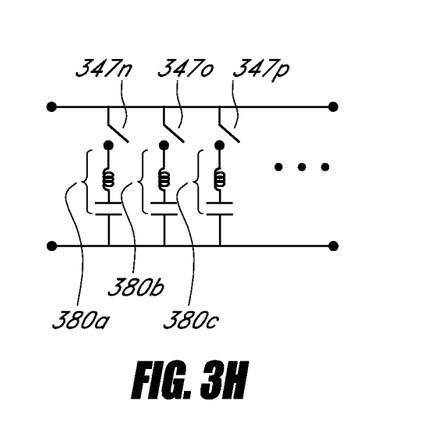
Figure 3I:
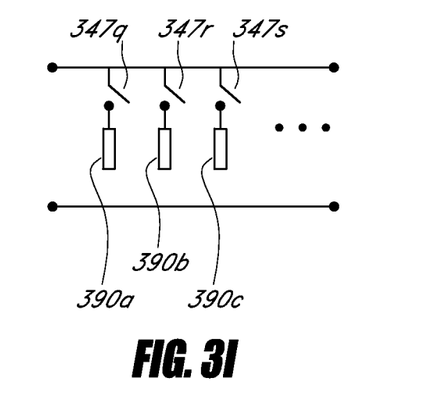

With reference now to FIGS. 3F-3I, various embodiments of switchable impedance matching elements are shown. For example, in the embodiment of FIG. 3F, the switchable impedance matching element 350 (of FIG. 3E) is shown including capacitors 360a, 360b, 360c, each in series with switches 347h, 347i, 347j. In the embodiment of FIG. 3G, the switchable impedance matching element includes inductors 370a, 370b, 370c, each in series with one of switches 347k, 347l, 347m. In the embodiment of FIG. 3H, the switchable impedance matching element includes LC circuits 380a, 380b, 380c that includes a capacitor in series with an inductor, each in series with one of switches 347n, 347o, 347p. In other embodiments, it is possible for the LC circuits 380a, 380b, 380c to include a switch that is connected in series with an inductor and a capacitor, but where the inductor and the capacitor are connected in parallel to each other. Finally, in the embodiment of FIG. 3I, the switchable impedance matching element includes transmission line stubs 390a, 390b, 390c, each in series with one of switches 347q, 347r, 347s. In the illustrated embodiment, the transmission line stubs 390a, 390b, 390c are open stubs, but in other embodiments, the stubs 390a, 390b, 390c may be shorted stubs. In some embodiments, the stub 390a, 390b, 390c are ¼λ stubs (in which the length of λ is determined by the desired frequency characteristics of the impedance of the stubs 390a, 390b, 390c), but in other embodiments may have other lengths depending upon the application. Stubs having other lengths can alternatively be used.

RF Mixers

FIGS. 4A-4D illustrate various embodiments of a mixer that may be used in various embodiments of the electronic system 100, 200a, 200b of FIGS. 1A and 2A-2B. For example, with reference to FIG. 4A, in some embodiments, the mixer 210a can be a passive mixer, e.g., mixer 210a can mix between both input to output, as well as output to input, in addition to not needed standing DC current. Typically, a passive mixer has no actively-biased devices. For example, mixer 210 may include FETs (Field Effect Transistors), JFETs (Junction gate FETs), MESFETs (Metal Semiconductor FETs), MOSFETs (Metal-Oxide-Semiconductor FETs), Multiple Gate FETs, Multiple Independent Gate FETs, Schottky diodes or other kinds of diodes, to name some examples. Such devices may be silicon-based, gallium-based (for example, gallium arsenide), and/or indium-based (for example, indium phosphide). More generally, devices included in the design of the mixer 210 may include any semiconductor material which can realize a MOSFET or MESFET. The mixer 210 may, in various embodiments, include one or more of the following mixer types: single-ended, single balanced, double balanced, triple balanced, and double-double balanced mixers.

Figure 4A:
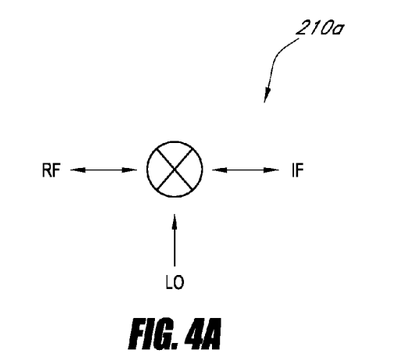
FIGS. 4A-4D illustrate various embodiments of a mixer.
Figure 4B:
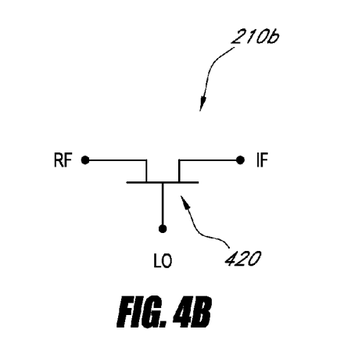

For example, with reference to FIG. 4B, the illustrated mixer 210b is a single-ended mixer. FIG. 4B is an example of a simple singled ended mixer, but other single-ended mixer designs are possible. For example, some single-ended mixers may use one or more diodes instead of the illustrated transistor. Similarly, some single-ended mixers may use more than one transistor. As illustrated, the transistor 420 is a MESFET or other kind of FET, however, the transistor 420 may be a MOSFET.

Figure 4C:
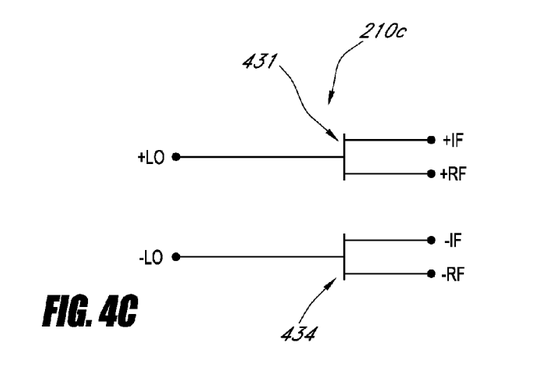
Figure 4D:
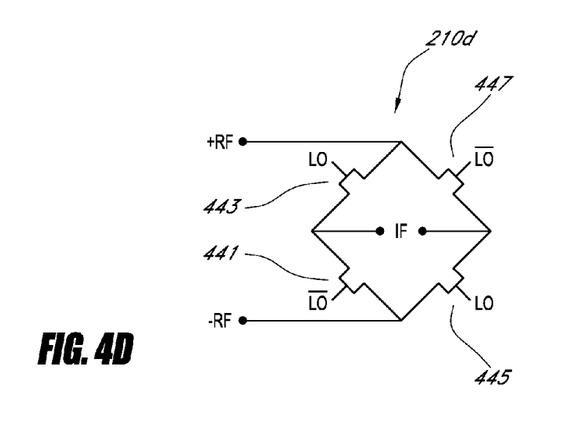

With reference now to FIG. 4C, mixer 210c may be a single balanced mixer. In the illustrated embodiment, a single balanced mixer includes two transistors 431, 434. In the illustrated embodiment, the transistors 431, 434 are MOSFETs. Single balanced mixers using diodes are also applicable.

With reference now to FIG. 4C, the mixer 210c may be a double balanced mixer. For example, a simple double balanced mixer design may include four transistors 441, 443, 445, 447. In other embodiments (not illustrated), the mixer 210c may be a triple or double-double balanced mixer. Single balanced, double balanced, triple balanced, and double-double balanced mixers may be useful to provide isolation from one of the inputs to the output. For example, in the embodiments of FIGS. 4C and 4D, the input that is to be isolated is the LO signal. In many applications, the LO signal can be difficult to filter out from the output, and hence balanced mixers may be useful.

Figures 5A, 5B:
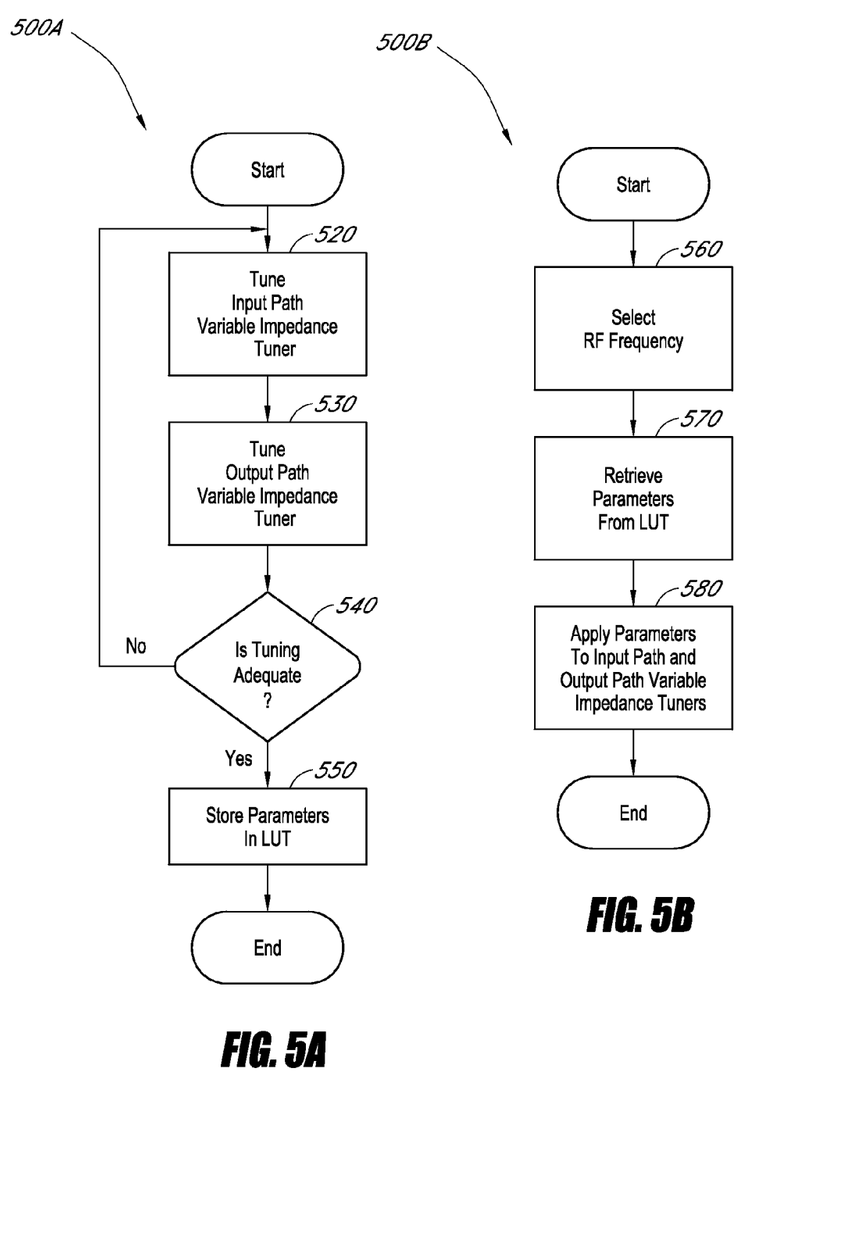
FIGS. 5A and 5B are flow charts that illustrate a process for tuning a wideband mixer according to an embodiment of the invention.

FIG. 5A is a flow chart illustrating an embodiment of a process 500A for tuning a wideband mixer. The illustrated process 500A can be used to generate and store parameters for a lookup table (LUT) that can be later used during normal operation. For example, the illustrated process 500A can be performed during the design or analysis phase or during manufacturing, such as during production test. It will be appreciated by the skilled practitioner that the illustrated process 500A can be modified in a variety of ways. For example, in another embodiment, various portions of the illustrated process 500A can be combined, can be rearranged in an alternate sequence, can be removed, or the like. The wideband mixer may include an RF mixer and an input path variable impedance tuner disposed in a first signal path between an RF input and the RF mixer, as well as an output path variable impedance tuner disposed in a second signal path between the RF mixer and an IF output. The illustrated process 500A is applicable to a particular LO, RF, and IF frequency or band of frequencies, and can be repeated as necessary for different frequencies such that the desired spectrums of interest are covered.

The process 500A begins by initially tuning, that is, adjusting the configuration or impedance of, an input path variable impedance tuner for a frequency or band of interest as shown in the block 520. For example, a control voltage can be used to tune the input path variable impedance tuner. The process 500A advances from the block 520 to a block 530.

In the block 530, the process 500A proceeds to tune the output path variable impedance tuner. It should be noted that because the mixers of the impedance tuners are reciprocal in nature, tuning the output path variable impedance tuner also affects the input impedance and vice-versa. The process 500A advances from the block 530 to a decision block 540.

In the decision block 540, the process 500A analyzes whether the tuning is adequate. For example, a network analyzer can be used to perform the analysis. A wide range of criteria can be used to assess whether the tuning is adequate. For example, a metric such as being within 5% or 10% of a target impedance value can be used. If the tuning is not adequate, the process 500A returns to the block 520 to continue with tuning. If the tuning is adequate, the process 500A proceeds to store the relevant parameters in the block 550, such as control voltages, in lookup table for future use. The process 500A can be repeated as desired for other combinations of frequencies.

In some embodiments and in the description of FIG. 5A, the input can be an RF input and the output can be an IF output. In other embodiments, the RF port may be the output. The configuration of the RF input variable impedance tuner can vary based on the RF input frequency that the mixer is to receive. For example, it can be determined that for a given desired RF input frequency, the configuration of the RF input variable impedance tuner should be set to close switches on two shunt LC circuits in the embodiment of a variable impedance tuner of FIG. 3H, while leaving the remaining LC circuits open. Such a configuration, for example, can result in a wideband mixer presenting a desired input impedance. For example, digital signals can be sent to close switches 347n and 347o (FIG. 3H). This configuration may be determined from a look-up table based upon parameters such as the given mixer design, the current or expected configuration of the IF output variable impedance tuner, the desired input impedance, and the desired RF input signal frequency.

In some embodiments, the frequency of operation for the output path variable impedance tuner is an IF frequency, and hence the output path variable impedance tuner may be tuned to have a particular impedance at an IF frequency in order to present a desired impedance at the output at the IF frequency. The output path variable impedance tuner may be tuned by configuring it in much the same way as that described above for the input path variable impedance tuner.

With continued reference to FIG. 5A, tuning the impedance on the input path variable impedance tuner (block 520) and tuning the impedance on the output path variable impedance tuner (block 530) may include independently tuning the impedances of the input and the output path variable impedance tuners to present a first desired impedance at the RF port (input) and a second desired impedance at the IF port (output) for the one or more frequencies of operation. For example tuning the input path variable impedance tuner and output path variable impedance tuner can include independently tuning the impedances of the input and output path variable impedance tuners so that the wideband mixer presents [1] a first desired impedance at the RF port at a first frequency of operation and a low impedance at the RF port at a second frequency of operation and a third frequency of operation, and [2] a second desired impedance at the IF port at the second frequency of operation and a low impedance at the IF port at the third frequency of operation. The first frequency of operation may be an RF frequency, the second frequency of operation may be a lower sideband which may be a difference between an LO and RF frequency, and the third frequency of operation may be a sum of the LO frequency and the RF frequency. The first and second desired impedances may be each about fifty (50) ohms and the low impedance may be below five (5) ohms. In other words, the RF and output path variable impedance tuners can be independently tuned so that the electronic system 200 presents, for example, fifty (50) ohms at the RF port at 900 MHz and five (5) ohms at the RF port at 500 MHz and 2300 MHz, while also presenting fifty (50) ohms at the IF port at 500 MHz and five (5) ohms at 2300 MHz.

While the block 520 is illustrated in the process 500A as occurring before block 530, in some embodiments, the block 530 may occur earlier than the block 520. In other words, the input or output path variable impedance tuner can be tuned first, and the other of the output or the input variable impedance tuner can be tuned second. In an alternative embodiment, the blocks 520 and 530 may be tuned simultaneously.

FIG. 5B shows a flow chart illustrating an embodiment of a process 500B. In the illustrated embodiment, the process 500B retrieves data from a lookup table (LUT), such as one created by execution of the process 500A of FIG. 5A. The impedance characteristics of the input path variable impedance tuner and the output path variable impedance tuner may be adjusted independently at the same time, or at nearly the same time. Advantageously, the impedances can be adjusted in real time, while the device is in operation. It will be appreciated by the skilled practitioner that the illustrated process can be modified in a variety of ways. For example, in another embodiment, various portions of the illustrated process can be combined, can be rearranged in an alternate sequence, can be removed, or the like. The process 500B begins with selecting an RF frequency associated with an electronic system that includes an RF mixer as shown in a block 560. The discussion of FIG. 5B that follows will focus on an embodiment in which the RF signal is the input signal. An RF frequency can be selected by selecting the frequency of the LO input signal.

For example, the RF mixer may initially be operating at a first RF frequency of operation. Then, at the block 560, a particular RF frequency can be selected, for example, changed from the first RF frequency of operation to a second RF frequency of operation. The process 500B then advances to a block 570 to retrieve the relevant parameters for the selected frequencies from a lookup table. The lookup table can contain the parameters that had earlier been determined and collected during execution of the process 500A (FIG. 5A). The process then advances from the block 570 to a block 580, in which the retrieved parameters, such as control voltages, are applied to the input path and the output path variable impedance tuners. The preferred impedances of the input and output path variable impedance tuners may combine with each other and with other impedances in the electronic system to present a desired input impedance at the input frequency at the input of the electronic system, and to present a desired output impedance at the output frequency at the output of the electronic system.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Applications

Devices employing the above described tuners and processes can be implemented into various electronic devices. Examples of the electronic devices can include, but are not limited to, consumer electronic products, parts of the consumer electronic products, electronic test equipment, and RF, microwave, and high frequency circuits generally. Examples of the electronic devices can also include antennas, cellular base stations and other cellular and mobile device infrastructure, and circuits of optical networks or other communication networks. The consumer electronic products can include, but are not limited to, a personal or hand-held computer, a video game console, Smartphone, digital audio player, or other Wi-Fi device; a mobile phone, a telephone, a television, a computer, a hand-held computer, a personal digital assistant (PDA), a microwave, a radio, a global positioning system (GPS) device, a remote control device, a wireless network terminal, etc. Further, the electronic device can include unfinished products.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus comprising:
an input configured to receive an input signal;
a local oscillator (LO) input configured to receive an LO signal;
a passive radio-frequency (RF) mixer configured to generate an output signal based at least partly on the input signal and the LO signal;
an output configured to provide the output signal;
an input path variable impedance tuner operatively coupled to and disposed in a first signal path between the input and the passive RF mixer; and
an output path variable impedance tuner operatively coupled to and disposed in a second signal path between the RF mixer and the output, wherein an impedance of the input impedance tuner at one or more input frequencies of operation and an impedance of the output impedance tuner at one or more output frequencies of operation are controllable by one or more control signals, wherein there is no biasing circuit configured to bias the passive RF mixer,
wherein the input path variable impedance tuner comprises a balun transformer, and the input path variable impedance tuner comprises a first sub-tuner and a second sub-tuner, and wherein the balun transformer is operatively coupled to and disposed in the first signal path between the first sub-tuner and the second sub-tuner.

2. The apparatus of claim 1, wherein:
the input comprises an RF input and the one or more input frequencies of operation comprise one or more RF frequencies, and
the LO signal comprises one or more LO frequencies.

3. The apparatus of claim 2, wherein the RF mixer comprises a single-ended, single-balanced, double-balanced, triple-balanced, or double-double balanced mixer.

4. The apparatus of claim 2, wherein:
the one or more RF frequencies comprise a first RF frequency and a second RF frequency; and
the impedances of the input path variable impedance tuner and the output path variable impedance tuner are independently controllable to present a first substantially constant impedance at the RF input and a second substantially constant impedance at the IF output for both the first RF frequency and the second RF frequency.

5. The apparatus of claim 4, wherein the first, second, third, and fourth desired impedances each comprises an impedance selected from the group comprising about fifty (50) ohms, about seventy-five (75) ohms, less than five (5) ohms, and at least 1000 ohms.

6. The apparatus of claim 4, wherein at least one of the input path variable impedance tuner or the output path variable impedance tuner comprises an LC impedance-matching network comprising both a variable capacitor and a variable inductor.

7. The apparatus of claim 4, wherein at least one of the input path variable impedance tuner or the output path variable impedance tuner comprises an array of two or more switchable impedance-matching elements connected in series or parallel, the switchable impedance matching elements being configured to be controlled by one or more digital signals.

8. The apparatus of claim 7, wherein the switchable impedance-matching elements each comprise a switch connected in series with one or more of a capacitor, inductor, or a transmission line, and wherein the switch is capable of being switched open or closed thereby rendering each of the input path variable impedance tuner and the output path, variable impedance tuner controllably capable of having two or more different impedances at a given frequency.

9. The apparatus of claim 2, wherein the RF mixer, the input path variable impedance tuner, and the output path variable impedance tuner are embodied in an integrated circuit.

10. The apparatus of claim 2, wherein the impedances of the input path variable impedance tuner and output path variable impedance tuner are independently controllable.

11. The apparatus of claim 1, wherein the apparatus is configured as an upconverter, wherein:
the input signal comprises a baseband signal; and
the output signal comprises an RF signal and the one or more output frequencies of operation comprise one or more RF frequencies.

12. A method of adjusting impedances for a change in frequency of operation comprising:
during operation, tuning an impedance of an input path variable impedance tuner operatively coupled to and disposed in a first signal path between an input and a passive radio-frequency (RF) mixer, wherein the input is configured to receive an input signal and the RF mixer configured to generate an output signal at an output based at least partly on the input signal and a local oscillator (LO) signal input received at an LO input using one or more control signals, wherein there is no biasing circuit configured to bias the passive RF mixer; and
during operation, tuning an impedance of an output path variable impedance tuner operatively coupled to and disposed in a second signal path between the RF mixer and the output using the one or more control signals,
wherein the input path variable impedance tuner comprises a balun transformer, and the input path variable impedance tuner comprises a first sub-tuner and a second sub-tuner, and wherein the balun transformer is operatively coupled to and disposed in the first signal path between the first sub-tuner and the second sub-tuner.

13. The method of claim 12, further comprising switching an operation of the RF mixer from a first input frequency of operation to a second input frequency of operation, wherein tuning the impedance on the input path variable impedance tuner and tuning the impedance on the output path variable impedance tuner comprises tuning the impedances of the input path and output path variable impedance tuners to present (1) a desired input impedance at the input at the second input frequency and (2) a desired output impedance at the output at a second output frequency.

14. The method of claim 12, wherein
the input is an RF input, and
the output is an intermediate-frequency (IF) output.

15. The method of claim 12, further comprising switching an operation of the RF mixer from a first input frequency of operation to a second input frequency of operation, wherein tuning the impedance on the input path variable impedance tuner and tuning the impedance on the output path variable impedance tuner comprises tuning the impedances of the input path and output path variable impedance tuners to present (1) a desired input enhancement or rejection of a third input frequency at the input impedance and (2) a desired enhancement or rejection of the third input frequency at the output at a second output frequency.

16. An apparatus comprising:
an input configured to receive an input signal;
a local oscillator (LO) input configured to receive an LO signal;
a passive radio-frequency (RF) mixer configured to generate an output signal based at least partly on the input signal and the LO signal, wherein there is no biasing circuit configured to bias the passive RF mixer;
an IF output configured to provide the IF signal as an output;
input path tuning means for providing a controllable variable impedance using one or more control signals, the input path tuning means operatively coupled to and disposed in a first signal path between the RF port and the passive RF mixer; and
output path tuning means for providing a controllable variable impedance using the one or more control signals, the output path tuning means operatively coupled to and disposed in a second signal path between the passive RF mixer and the IF port,
wherein the input path tuning means comprises a balun transformer, and the input path tuning means comprises a first sub-tuner and a second sub-tuner, and wherein the balun transformer is operatively coupled to and disposed in the first signal path between the first sub-tuner and the second sub-tuner.

17. An apparatus comprising:
an input configured to receive an input signal;
a local oscillator (LO) input configured to receive an LO signal;
a passive radio-frequency (RF) mixer configured to generate an output signal based at least partly on the input signal and the LO signal, wherein there is no biasing circuit configured to bias the passive RF mixer;
an IF output configured to provide the IF signal as an output;
input path tuning means for providing a controllable variable impedance at both the input frequency and a different variable impedance at an unwanted frequency using one or more control signals, the input path tuning means operatively coupled to and disposed in a first signal path between the RF port and the passive RF mixer; and
output path tuning means for providing a controllable variable impedance using the one or more control signals, the output path tuning means operatively coupled to and disposed in a second signal path between the passive RF mixer and the IF port such that the output path tuning means simultaneously passes the desired input signal and rejects an unwanted input signal,
wherein the input path tuning means comprises a balun transformer, and the input path tuning means comprises a first sub-tuner and a second sub-tuner, and wherein the balun transformer is operatively coupled to and disposed in the first signal path between the first sub-tuner and the second sub-tuner.

* * * * *